United States Patent [19]

Van Cang

[11] Patent Number: 4,709,343

[45] Date of Patent: Nov. 24, 1987

[54] VARIABLE-PASSBAND VARIABLE-PHASE DIGITAL FILTER

[75] Inventor: Luc P. Van Cang, Savigny sur Orge, France

[73] Assignee: Thomson CSF, Paris, France

[21] Appl. No.: 687,464

[22] Filed: Dec. 28, 1984

[30] Foreign Application Priority Data

Dec. 30, 1983 [FR] France .................... 83 21102

[51] Int. Cl.$^4$ ............................. G06F 15/31
[52] U.S. Cl. ..................................... 364/724
[58] Field of Search ............... 364/724; 333/18, 28 R, 333/152, 166, 167, 156; 375/11-14

[56] References Cited

U.S. PATENT DOCUMENTS

| 3,822,404 | 7/1974 | Croisier et al. | 364/724 |
| 3,993,890 | 11/1976 | Peled et al. | 364/724 |
| 4,374,426 | 2/1983 | Burlage et al. | 364/724 |
| 4,484,299 | 11/1984 | Lambourn et al. | 364/724 |

OTHER PUBLICATIONS

Jenkins, "A Comparison of Residue Number Multipliers and 2's Complement Multipliers Implement by Store Multiplication Tables" 1978 IEEE Inter. Symposium on CKT & SYS. Proceedings.

Liu et al., "A Note on Implementation of Digital Filters" IEEE Trans. on Acoustics, Speech, and Signal Processing, Aug. 1975, pp. 387–389.

Schroder, "High Word-Rate Digital with Programmable Table Look-Up" IEEE Trans. on Circuits & Systems, May 1977, pp. 277–279.

Primary Examiner—Gary V. Harkcom
Assistant Examiner—Tan Van Mai
Attorney, Agent, or Firm—Cushman, Darby & Cushman

[57] ABSTRACT

A variable-passband, variable-phase digital filter in which Q digital samples of a signal are entered through (Q−1) delay lines, to be delayed into q two-bit adjacent doublets. Weighting tables in read only memories are addressed by each doublet. Each weighting table includes the results of linear combinations of the weights of doublets composed of bits of the same order multiplied by multiplier coefficients which are smaller than unity. Each integral portion of a result found in a table is applied at the same time as the fractional portions of the other results provided by the other tables to the addressing inputs of a programmed memory containing binary words. Binary words are addressed in the prorammed memory by the integral and fractional portions of the results found in the weighting tables. Each binary word has a value equal to the linear combination of the corresponding values of the samples of the signal by the multiplier coefficients.

11 Claims, 10 Drawing Figures

VARIABLE-PASSBAND VARIABLE-PHASE DIGITAL FILTER

BACKGROUND OF THE INVENTION

1. Field of the Invention

The present invention relates to a variable-passband variable-phase digital filter. Potential applications include filtering of audio-frequency signals and television signals as well as the construction of many electronic devices such as frequency synthesizers, for example.

2. Description of the Prior Art

Variable-passband variable-phase digital filters also find an application in the audiovisual field for removing defects which appear at a time of geometrical transformations carried out with digital image memories, in particular in the event of anamorphic effects and compressions which produce moiré effects and flicker effects on the transformed image.

Digital filters at present in use generally have transversal or recursive filter structures constituted by arrays of multiplier circuits, the variation in passband being obtained by weighting of the multiplier coefficients of the digital signal samples stored within registers of the filter.

Typically, n sets of coefficients are usually employed for the purpose of obtaining n different passbands.

Concurrently with the passband variation, digital filters corresponding to the mode of utilization just mentioned sometimes have structures which also permit interpolation of m intermediate values between two successive samples of the signal, with the result that $m \times n$ sets of weighting coefficients are usually applied to these filters. In the known examples of construction, n is of the order of 16 and m is of the order of 4.

The structures of digital filters constructed by means of multiplier circuits have the main disadvantage of being costly.

It is possible to overcome this disadvantage by constructing variable-passband and variable-phase filters in accordance with a table look-up technique. In this technique, results which are equivalent to those mentioned in the foregoing can be obtained by constructing a table of numerical values stored within a memory which provides the filtered values of the signal as a function of the digital samples of the signal to be filtered which are applied to the memory-addressing inputs of the memory. Depending on the applications which are contemplated, it is equally possible to store said table either in a read-only memory (ROM) or in a random-access memory (RAM). The application of this structure to the problem of filtering of digital-signal samples does not present any difficulty. It is, in fact, only necessary to apply for example to the addressing inputs of the memory N bits for selecting $2^N$ filters, M bits for selecting $2^M$ phases and $p \times 8$ bits for applying the p "signal" inputs. There is thus obtained, for example, on the outputs of the memory an output signal coded on 8 bits corresponding to each address combination applied to the addressing inputs of the memory. Unfortunately, this structure cannot be realized directly when the numbers of passbands, phases and "signal" inputs become substantial. For example, in order to construct a filter having sixteen passbands, four phases and three inputs, this technique in fact entails the need for a table composed of 1000 mega-octets with thirty address lines, which is clearly neither technically nor economically feasible.

SUMMARY OF THE INVENTION

The aim of the invention is to overcome the disadvantages mentioned in the foregoing.

To this end, the invention is directed to a variable-passband variable-phase digital filter of the type in which Q digital samples of the signal to be filtered which are coded on $2 \times q$ bits are applied successively via $Q-1$ delay lines connected in series and in which the values of the delayed samples collected at the output of each delay line are weighted by Q multiplier coefficients which are smaller than one before being added, the results of the successive additions being such as to form a series of samples representing the filtered digital signal. The distinctive feature of said digital filter lies in the fact that structure is provided for subdividing each delayed sample into q adjacent two-bit doublets, a first storage structure addressed by each doublet in order to store weighting tables, each weighting table being composed of the results of linear combinations of the weights of the doublets taken from each sample and composed of bits of the same rank multiplied by the multiplier coefficients, each integral portion of a result found in a table being applied at the same time as the fractional portions of the other results provided by the other tables to the addressing inputs of second storage structure. Said second storage structure is programmed in such a manner as to ensure that the binary number addressed in the second storage structure by the integral and fractional portions of the results found in the first storage structure as a function of the values of the Q samples of the signal to be filtered has a value equal to the linear combination of the corresponding values of the Q samples of the signal by the Q multiplier coefficients.

BRIEF DESCRIPTION OF THE DRAWINGS

Other features of the invention will be more apparent upon consideration of the following description and accompanying drawings, wherein.

DETAILED DESCRIPTION OF THE INVENTION

Figure 1:
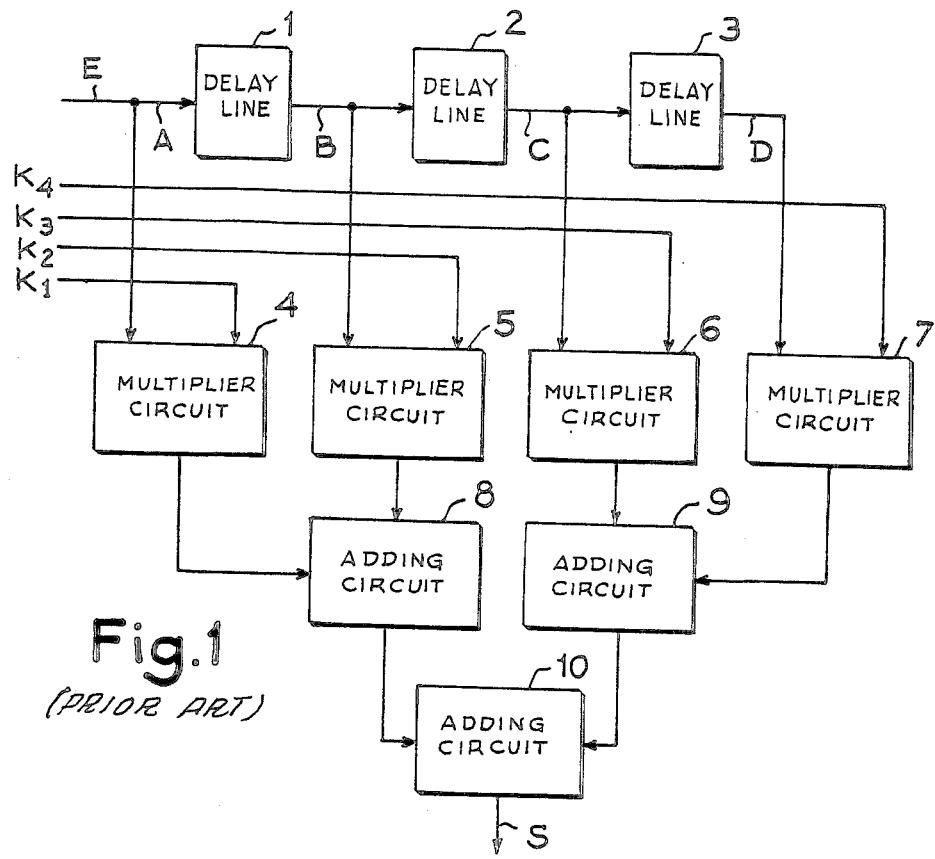
FIG. 1 is a transversal filter of the prior art.

The digital filter shown in FIG. 1 is a transversal filter of the prior art constituted by an array of series-connected delay lines 1, 2, 3, an array of multiplier circuits 4, 5, 6, 7, and an assembly of adders designated respectively by the references 8, 9 and 10. Each signal sample E coded, for example on eight bits, is applied simultaneously to the input of the first delay line 1 and to a first input of the multiplier circuit 4. The outputs of the delay lines 1, 2 and 3 are connected respectively to a first input of the multiplier circuits 5, 6 and 7. Weighting coefficients $K_1$, $K_2$, $K_3$ and $K_4$ are applied respectively to the second inputs of the multiplier circuits 4, 5, 6 and 7. The outputs of the multipliers 4, 5, 6 and 7 deliver respectively the product of the samples applied to their first inputs by the weighting coefficients $K_1$, $K_2$, $K_3$ and $K_4$. The outputs of the multipliers 4 and 5 are connected respectively to a first and a second input of an adding circuit 8 and the outputs of the multiplier circuits 6 and 7 are connected respectively to a first and a second input of the adding circuit 9. The outputs of the adding circuits 8 and 9 are connected respectively to a first input and a second input of the adding circuit 10. If A designates the value of the binary sample applied to the input of the first delay line 1 and B, C, D designate respectively the values of the samples obtained at the outputs of the delay lines 1, 2 and 3, the output of the adding circuit 10 delivers a signal coded on eight bits having a value corresponding to the linear combination of the sample values A, B, C and D by the weighting coefficients $K_1$, $K_2$, $K_3$ and $K_4$ in accordance with the relation $$S = K_1A + K_2B + K_3C + K_4D$$

with, for example, $$K_1 + K_2 + K_3 + K_4 = 1$$

Figure 2:
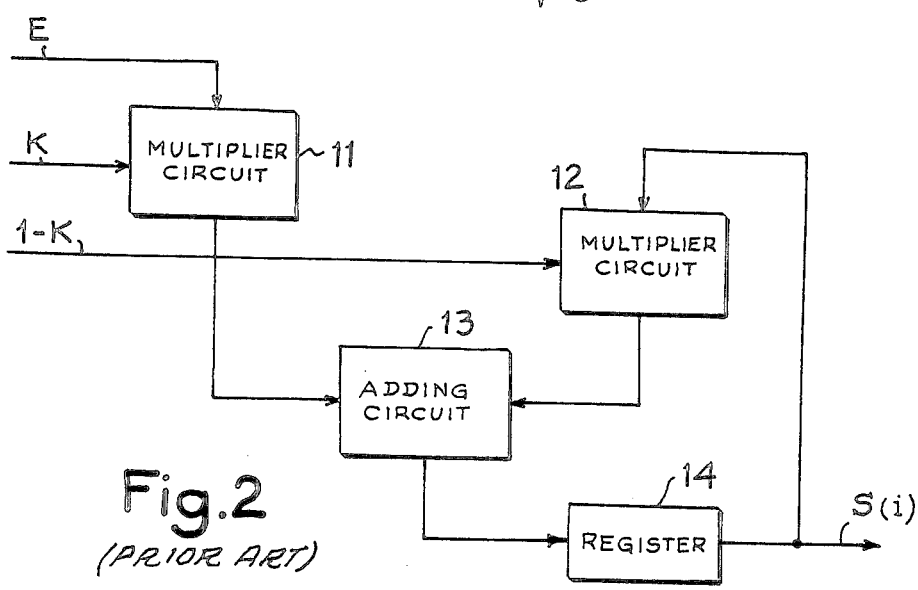
FIG. 2 is a recursive filter of the prior art.

The diagram shown in FIG. 2 is that of a recursive filter of the prior art composed of two multiplier circuits 11 and 12, an adding circuit 13 and a register 14. The sample of the sample E is applied to a first input of the multiplier circuit 11 which receives a weighting signal K on a second input. A first input of the multiplier circuit 12 is connected to the output of the register 14 and the second input of the multiplier circuit 12 receives a multiplier coefficient equal to 1−K. The outputs of the two multiplier circuits 11 and 12 are connected respectively to the first and second inputs of the adding circuit 13, the output of which is connected to the input of the register 14. This filter makes it possible to obtain at the output of the register 14 filtered signal samples which depend at each instant on the value of the signal sample which is present at the input of the filter and on the value of the signal which has previously been filtered. In fact, if E designates the value of the sample applied to the input of the filter and S(i−1) designates the value of the previously filtered signal sample, the value of the filtered sample corresponding to the input sample is equal to $$S(i) = K\ E + (1-K) \times S(i-1).$$

In the structures described earlier, the variation in passband of the filters is usually obtained by varying the value of the coefficients $K_1$, $K_2$, $K_3$ and $K_4$ applied to the inputs of the filter.

In audiovisual techniques, it also happens that, concurrently with the passband variation, it is necessary to interpolate intermediate values between two successive samples of the signal. The problem which usually arises here consists in finding three intermediate values or phases in order to obtain a suitable quality transformation. As a general rule, n sets of coefficients are employed, thus making it possible to obtain n different passbands. The value of the coefficients are determined in real time or are loaded in a read-only memory (ROM). The interpolation can be obtained directly by the choice of the coefficients of the transversal filter by means of a set of m×n coefficients, where m designates the number of phases and n designates the number of passbands. In the known applications, m is for example of the order of 4 and n is of the order of 16. One disadvantage of the structures shown in FIGS. 1 and 2 lies in the fact that they make use of multiplier circuits which increase their cost price.

Figure 3:
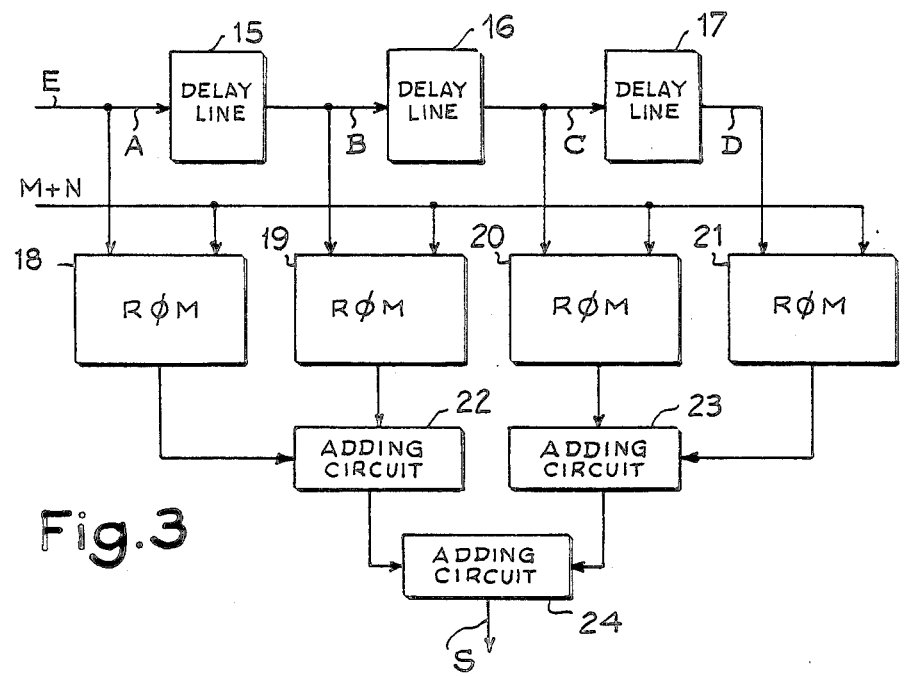
FIG. 3 shows one example of construction of a filtering device by means of a table.

In order to reduce the cost of construction, a first step consists in forming transversal filter structures of the type shown in FIG. 3. The digital filter which is illustrated in FIG. 3 comprises a first array of series-connected delay lines 15, 16 and 17, an array of four ROM-type memories designated respectively by the references 18 to 21, and an array of adding circuits designated respectively by the references 22 to 24. The sample E of the signal to be filtered is applied to the input of the delay line and to a first addressing input of the memory 18. The outputs of the delay lines 15, 16 and 17 are connected respectively to a first addressing input of the memories 19 to 21. The memories 18 to 21 have a second addressing input to which are applied the M+N bits for selecting m phases and n passbands. Each memory 18, 19, 20 or 21 contains a table for weighting each sample A, B, C, D which is applied to its first addressing input respectively by the coefficients $K_1$, $K_2$, $K_3$ and $K_4$. The values of the samples weighted by the tables contained in the memories 18 and 19 are added by the adding circuit 22. The values of the samples weighted by the tables contained in the memories 20 and 21 are added by the adding circuit 23. The adding circuit 24 adds the results provided by the respective outputs of each adding circuit 22 and 23 and produces a signal having eight bits corresponding to the linear combination of values of the samples A, B, C, D which are present at a given instant on the one hand at the input of the delay line 15 and at on the outputs of the delay lines 15, 16 and 17 as weighted by the coefficients $K_1$, $K_2$, $K_3$ and $K_4$, in accordance with the relation $$S = K_1A + K_2B + K_3C + K_4D.$$

The diagram of FIG. 3 permits the construction of four tables having fourteen inputs and eight outputs in order to form a total capacity of 64 kilo-octets. Unfortunately, the current technology of fast read-only memories (ROMs) which has cycle times of less than 74 nanoseconds (necessary in order to be compatible with television signals) fails to offer simple and inexpensive means for the construction of tables of this type. One approach in accordance with the invention for overcoming this disadvantage will hereinafter be explained in detail with reference to FIGS. 4 and 5.

Figure 4:
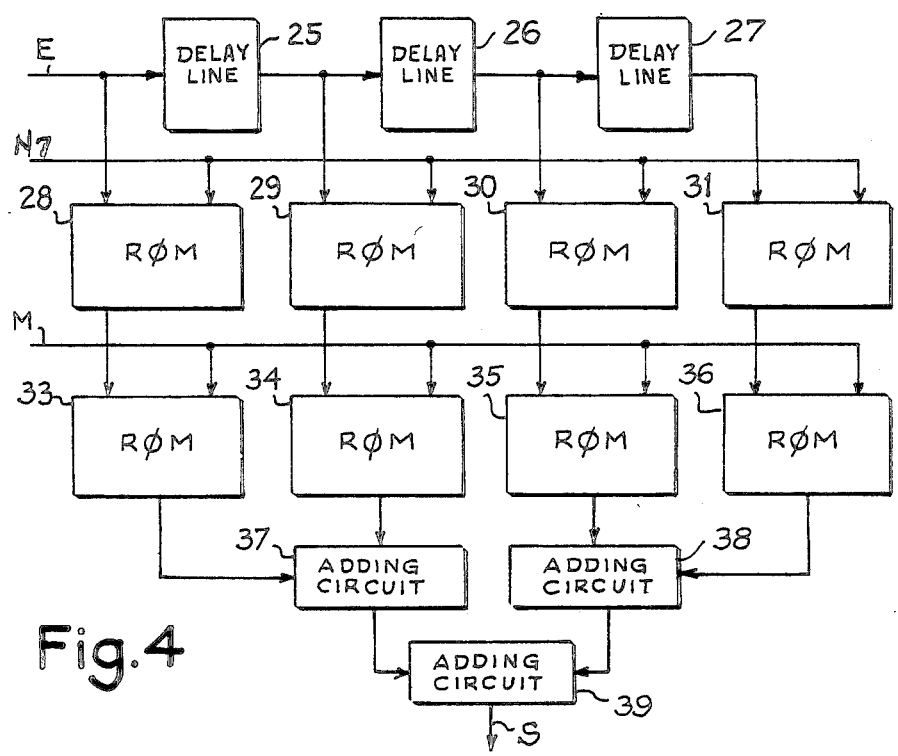
FIG. 4 shows one example of construction of a digital filter which operates in accordance with the table look-up technique, a separation of the filtering and interpolation functions being achieved in order to reduce the size of the memories which compose the filter.

The diagram of FIG. 4 shows a digital filter fabricated solely from ROMs having memory capacities varying between 1 and 4 kilo-octets. This diagram facilitates the construction of digital filters of the type mentioned above. The filter of FIG. 4 is constituted by an array of delay lines 25, 26, 27, an array of readonly memories (ROMs) 28 to 31 having a capacity of 4 kilo-octets, an array of read-only memories (ROMs) 33 to 36 having a capacity of 1 kilo-octets and an array of adding circuits 37 to 39. The delay lines 25, 26 and 27 are connected in series. The digital samples E which are to be filtered and are coded on eight bits, for example, are applied to the input of the delay line 25 and to a first addressing input of the memory 28. The memories 29 to 31 each have a first addressing input connected to the respective outputs of the delay lines 25 to 27. The second inputs of the memories 28 to 31 are addressed by the number N of selections of n passbands in order to assign a weighting coefficient to each of the samples applied to the first inputs of the memories 28 to 31. The weighted samples obtained at the outputs of the memories 28, 29 to 31 are applied respectively to a first input of the memories 33 to 36. A second addressing input of memories 33–36 receives the phase-selection bits M in order to address interpolation tables contained in the memories 33 to 36. The outputs of the memories 33 and 34 are applied respectively to a first and a second input of the adding circuit 37 and the outputs of the memories 35 and 36 are applied respectively to a first and a second input of the adding circuit 38. The outputs of the adding circuits 37 and 38 are applied respectively to a first input and a second input of the adding circuit 39 which delivers the output signal S of the filter over a length of eight bits.

Figure 5:
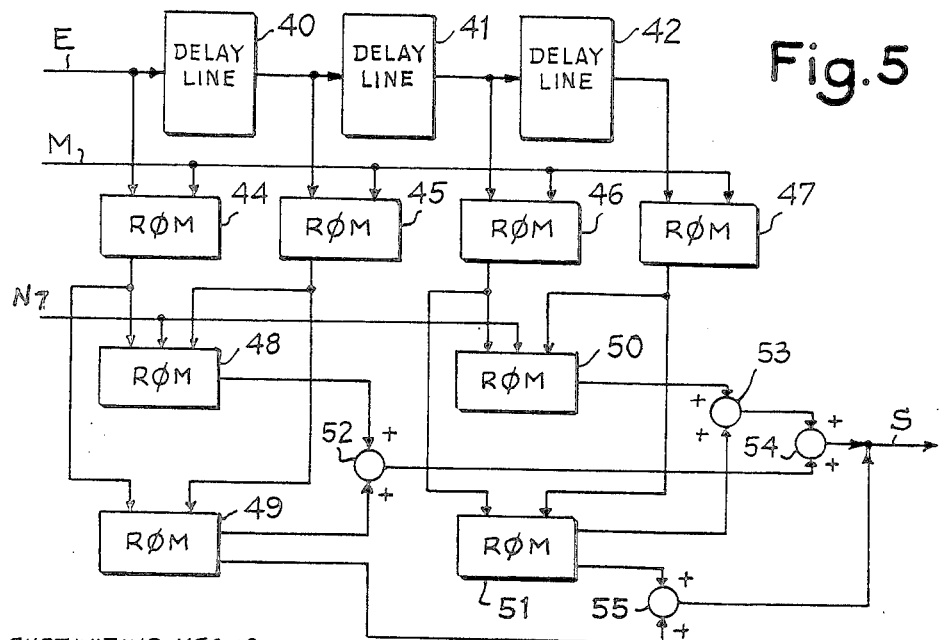
FIG. 5 shows a construction of a digital filter resulting in an even more effective partition of the tables.

Even greater partitioning of the filtering table can be obtained by means of a device of the type shown in FIG. 5. In this figure, the successive samples E of the signal which is coded on eight bits, for example, are applied, after having been delayed by the delay lines 40 to 42, to the addressing inputs of an array of memories 44 to 47 having a capacity of 1 kilo-octets and containing interpolation tables. The interpolated values of each signal sample are applied by the outputs of the memories 44 to 47 to the respective addressing inputs of an array of read-only memories (ROMs) 48 to 50. These memories contain the filtering tables proper. Each octet read at the output of the memories 44 to 47 is subdivided into two quartets having low and high weights. The low-weight quartets are applied to the addressing inputs of the memories 48 and 50 and the high-weight quartets are applied to the addressing inputs of the memories 49 and 51. Each table contained in the memories 48 to 51 is formed by the results of the linear combinations of each quartet applied to its addressing inputs by multiplier coefficients $K_1$, $K_2$, $K_3$ and $K_4$ which are smaller than unity. Since the multiplier coefficients are smaller than unity, the multiplications performed on the high-weight quartets produce a result composed of an integral portion and a fractional portion. The fractional portion is composed of the same binary weights as the result of the linear combinations of the low-weight quartets obtained at the outputs of the memories 48 and 50 and is added to these latter by means of the adding circuits 52, 53 and 54. The results of the linear combinations performed on the high-weight quartets and provided by the memories 49 and 51 are applied to the respective inputs of an adding circuit 55. The outputs of the adding circuits 54 and 55 are concatenated to eight-bit binary signal, the four low-weight bits being obtained at the output of the adder 54 and the four high-weight bits being obtained at the output of the adder 55. The filters of FIGS. 4 and 5 have the further disadvantage of requiring the use of adding circuits for recombining the signals produced by the different tables which are stored in the memories of the filter.

Figure 6:
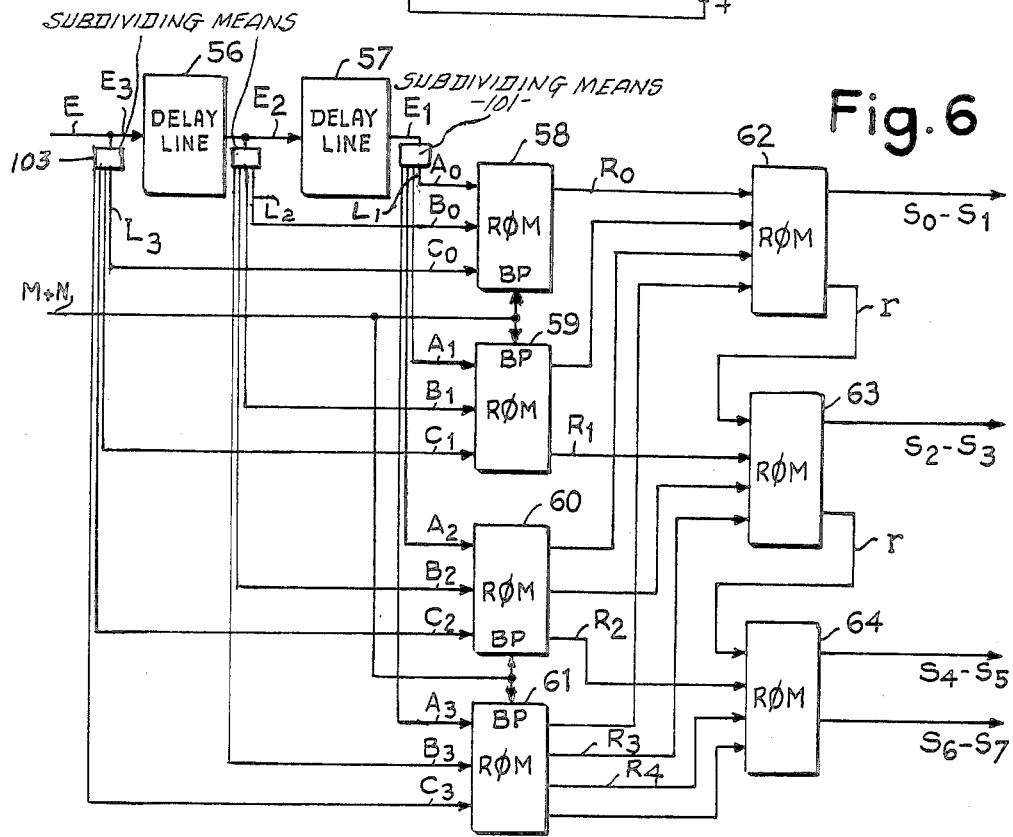
FIG. 6 shows one embodiment of a digital filter in accordance with the invention.

The filter shown in FIG. 6 makes it possible to dispense with the need for the adding circuits mentioned in the foregoing. This filter comprises delay lines 56 and 57, means for storage of filtering tables 58 to 61 coupled by their outputs to second means for storage of addition tables. The delay lines delay the samples E successively by eight bits. These delays which are applied to the input of the delay line 56. Each eight-bit sample $E_1$, $E_2$, $E_3$ thus obtained is subdivided by subdividing means 101, 102 and 103, respectively, into subsignals, in this can two-bit doublets before being applied via the lines $L_1$ to $L_3$ to the input of the first storage means. The doublets constituted by the low-weight bits are applied to the addressing inputs of the memory 58 and the following doublets constituted by the remaining bits are applied in the order of magnitude of their binary weights to the addressing inputs of the memories 59 to 61. In accordance with this principle, if the references $E_1$ and $E_2$ are used to designate the binary samples delivered by the delay lines 57 and 56 and if the reference $E_3$ is used to designate the sample applied to the input of the delay line 56, then by expressing each sample in the form $$E_1 = \sum_{i=0}^{7} a_i 2^i$$

$$E_2 = \sum_{i=0}^{7} b_i 2^i$$

$$E_3 = \sum_{i=0}^{7} c_i 2^i$$

the subdivision into doublets can be realized by the relations:

$$E_1 = \sum_{j=0}^{3} A_j, \; E_2 = \sum_{0}^{3} B_j, \; E_3 = \sum_{0}^{3} C_j$$

with $$A_j = a_{2j+1} \cdot 2^{2j+1} + a_{2j} \cdot 2^{2j}$$

$$B_j = b_{2j+1} \cdot 2^{j+1} + b_{2j} \cdot 2^{2j}$$

$$C_j = c_{2j+1} \cdot 2^{j+1} + c_{2j} \cdot 2^{2j}.$$

With reference to FIG. 6, the doublets $A_0$, $B_0$ and $C_0$ formed by the bits having the lowest weights are applied to the addressing inputs of the memory 58. The doublets $A_1$, $B_1$, $C_1$ formed by the bits of directly higher weight are applied to the addressing inputs of the memory 59. The doublets $A_2$, $B_2$, $C_2$ are applied to the inputs of the memory 60 and the doublets $A_3$, $B_3$, $C_3$ formed by the highest-weight bits of each sample are applied to the addressing inputs of the memory 61. Each table contained in the memories 58 to 61 is formed by the results of the linear combinations of values of each doublet applied to its addressing inputs. If the coefficients which are all smaller than unity of each linear combination are designated as before by the references $K_0$, $K_1$ and $K_2$, each result $R_0$ to $R_3$ stored in a table 58 to 61 is obtained by applying the matrix relation $$\begin{bmatrix} R_0 \\ R_1 \\ R_2 \\ R_3 \end{bmatrix} = \begin{bmatrix} A_0 & B_0 & C_0 \\ A_1 & B_1 & C_1 \\ A_2 & B_2 & C_2 \\ A_3 & B_3 & C_3 \end{bmatrix} \times \begin{bmatrix} K_0 \\ K_1 \\ K_2 \end{bmatrix}$$

Since the multiplier coefficients $K_0$, $K_1$, $K_2$ are chosen so as to be smaller than unity in the same manner as the preceding examples, the multiplications performed on the doublets formed by bits having higher weights than the two first low-weight bits of a sample produce results composed of an integral portion and a fractional portion. In FIG. 6, the integral portions of the results $R_0$, $R_1$ and $R_2$ are read from memories 58 to 60 at the address indicated by the values of doublets which are present on their addressing inputs and are applied respectively to the addressing inputs of the memories 62 to 64 constituting the second storage means. The results $R_3$ and $R_4$ derived from the memory 61 are applied at the same time as the result $R_2$ to the addressing inputs of the memory 64. The fractional portions of the results $R_1$ and $R_4$ are applied as a function of their weights to the corresponding addressing inputs of the memories 62 to 64, the doublets composed of the lowest-weight bits being applied to the inputs of the memory 62 and the higher-weight bits being applied in their order of magnitude to the addressing inputs of the memories 63 and 64. The memories 62 to 64 are programmed in such a manner as to ensure that a binary number corresponds to each address combination supplied by the memories 58 to 61, namely the binary number $$S = \sum_{i=0}^{7} S_i 2^i$$

the value of which corresponds to the linear combination of the samples $E_1$, $E_2$, $E_3$ by the coefficients $K_0$, $K_1$, $K_2$ and $K_3$. In the example of FIG. 6, the memory 62 delivers the doublets $S_0$, $S_1$, the memory 63 delivers the doublets $S_2$, $S_3$ and the memory 64 delivers the doublets $S_4$, $S_5$ and $S_6$, $S_7$.

It is readily apparent that carry transfer lines r are provided between the memories 62, 63 and 63 and 64 in order to transfer to the addition memories any carry which can be read in an addition table for providing one of the doublets $S_0$, $S_1$, or $S_2$, $S_3$. Devices for compensating the carry-propagation time (not shown since they are within the capacity of any one versed in the art) could be added if necessary to the addressing inputs of the memories 62 to 64.

By choosing read-only memories (ROMs) having a capacity of 4 kilo-octets for the construction of the memories 58 to 61 and read-only memories (ROMs) having a capacity of 1 kilo-octet for the construction of the memories 62 to 64, the structure shown in FIG. 6 makes it possible to realize a digital filter composed of three coefficients, sixteen passbands and four phases selected on the inputs B and P of the memories 58 to 61. This structure can be integrated in modular form in order to be employed if necessary in filters of even more complex design of the type shown in FIGS. 7 to 10.

Figure 7:
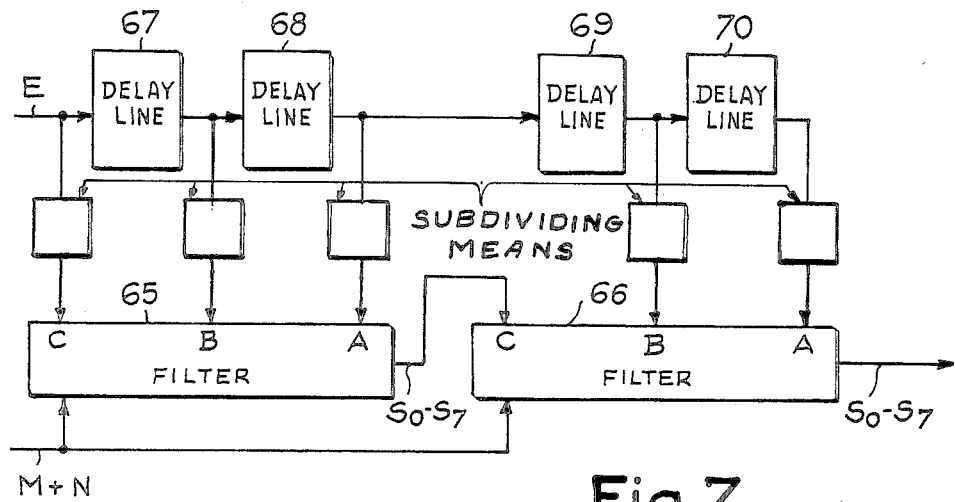
FIG. 7 represents a cascade-connection of two digital filters in accordance with the invention and similar to the filter shown in FIG. 6.

The diagram of FIG. 7 shows a combination of two cascade-connected filters 65 and 66 of the type shown in FIG. 6 for constructing a filter having five multiplier coefficients. Each sample is filtered and applied simultaneously to the input of the delay line 67 and to the input C of the first filter 65, the outputs of the delay lines 67 and 68 being applied respectively to the inputs B and A of the filter 65 and the outputs of the delay lines 69 and 70 being applied respectively to the inputs B and A of the filter 66. The output of the filter 65 which transmits the bits from $S_0$ to $S_7$ is connected to the input C of the filter 66. The filtered samples of the signal are obtained at the output of the filter 66.

Figure 8:
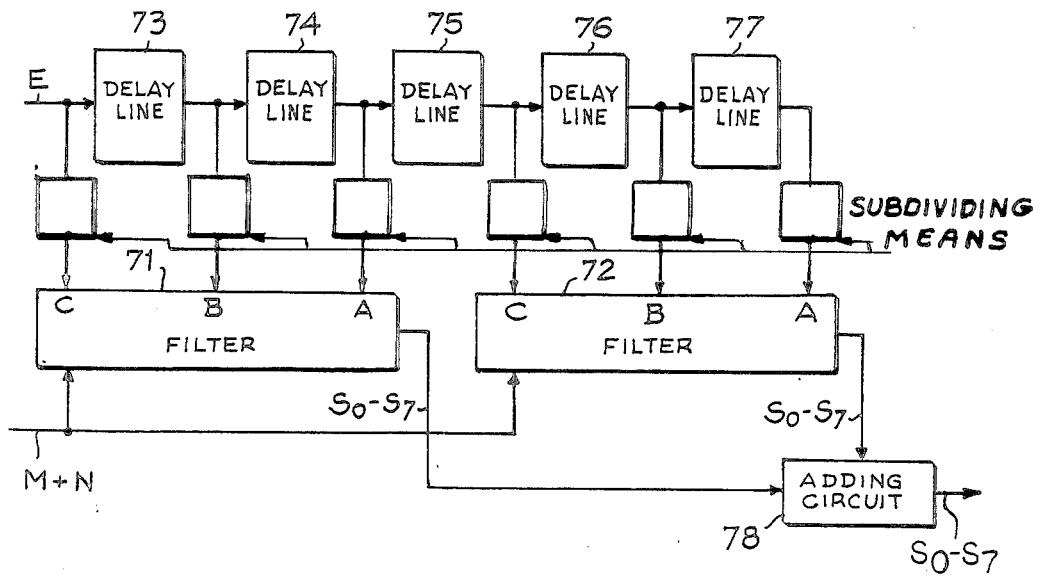
FIG. 8 shows an embodiment of another digital filter structure formed by means of elementary filters in accordance with the invention and of the type shown in FIG. 6.

The diagram of FIG. 8 shows a filter which has six coefficients and makes use of two filters 71 and 72 of the type described with reference to FIG. 6. Each sample E of the signal to be filtered is applied simultaneously to the input of a delay line 73 and to the input C of the first filter 71. Each sample of the signal is successively delayed by the delay lines 73 to 77. The outputs of the delay lines 73 and 74 are connected respectively to the inputs B and A of the filter 71 and the respective outputs of the delay lines 75 to 77 are connected respectively to the inputs C and A of the filter 72. The outputs of the filters 71 and 72 are connected respectively to a first input and a second input of an adding circuit 78 which delivers at its output the filtered samples of the signal which is coded on eight bits.

Figure 9:
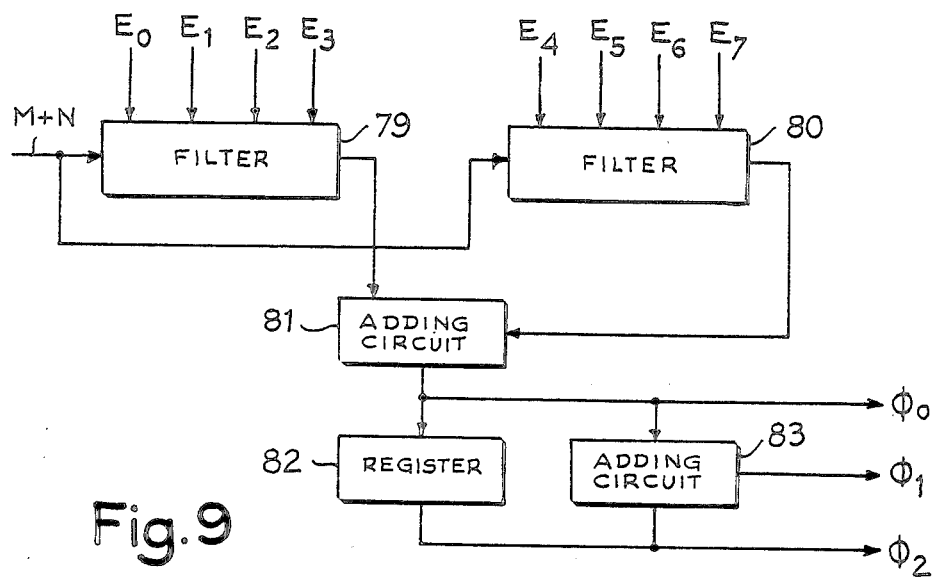
FIG. 9 represents another embodiment of a digital filter employed by means of elementary filters in accordance with the invention and of the type shown in FIG. 6.

The filter shown in FIG. 9 has eight coefficients and is provided with a linear phase shifter. This assembly comprises two filters 79 and 80 of the same type as that shown in FIG. 6. Each output of the filters 79 and 80 is connected to a first and a second input of an adding circuit 81, the output of which is connected to a register 82. The input and the output of said register 82 are connected respectively to a first input and a second input of an adding circuit 83 which serves to add the value of the sample delivered by the adding/circuit 81 to the preceding sample stored in the register 82 in order to provide a sample value equal to the sum of the two samples.

Figure 10:
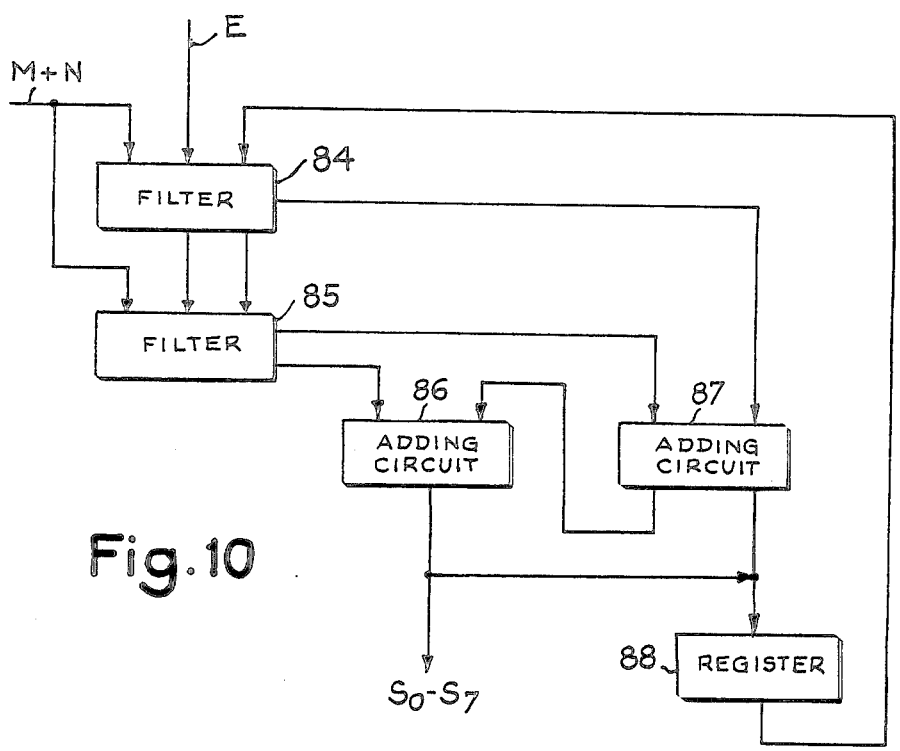
FIG. 10 is an example of construction of a recursive filter obtained by means of an assembly of elementary filters of the type shown in FIG. 6.

FIG. 10 illustrates a recursive filter structure obtained from two filters 84 and 85 of the same type as the filter shown in FIG. 6. This structure makes it possible to obtain a recursive filter of order 1 from two adding circuit 86 and 87 and from register 88 oonnected to the output of the adding circuit 86.

The invention is not limited to the forms of construction described in the foregoing. It will be understood that the invention is equally applicable to any alternative forms of construction which, instead of filtering signals formed by eight-bit samples, could filter 2q-bit samples where q can be of any desired value. Furthermore, the invention is not limited to the number of samples Q which can be applied to the input of the filter. Irrespective of the number Q of samples applied, it is in fact possible to adapt the structure of the filter shown in FIG. 6 to a more or less extensive structure comprising $Q-1$ delay lines and Q coefficients.

What is claimed is:

1. A variable-passband variable-phase digital filter of the type in which Q digital samples of a signal to be filtered, which are coded on $2 \times q$ bits, are applied successively to $(Q-1)$ delay lines connected in series, and in which the values of the delayed samples are weighted by Q multiplier coefficients which are smaller than unity and are collected at outputs of each delay line, and are combined, to form a series of samples representing the filtered digital signal, comprising:

means for subdividing said sample to be filtered and each delayed sample into q adjacent, weighted two-bit doublets;

first storage means, coupled to said subdividing means to be addressed by each doublet, for storing weighting tables, each said weighting table results of linear combinations of weights of doublets composed of bits of the same rank multiplied by said multiplier coefficients, and producing at the same time an integral portion of said results in said weighting tables and fractional portions thereof;

second storage means having a plurality of addressing inputs receiving at the same time the integral and fractional portions thereof, and for ensuring that each binary number addressed in the second storage means by said integral and fractional portions of the results from said first storage means as a function of the values of the Q samples of the signal to be filtered, has a value equal to a linear combination of corresponding values of the Q samples of the signal by the Q multiplier coefficients.

2. A filter as in claim 1 further comprising a plurality of filters, connected in cascade.

3. A filter as in claim 1, further comprising adding circuits and a plurality of filters, wherein the outputs of said plurality of filters are connected to each other via said adding circuits.

4. A filter according to claim 1, wherein said first and second storage means include read only memories.

5. A digital filter, comprising:
means for delaying an input signal to produce delayed input signals;
means for subdividing said input signal and said delayed input signals into subsignals which are weighted by magnitude;
first storage means, having input address receiving structures coupled to said subsignals, for storing linear combinations of values of said subsignals, weighted by respective weighting factors and producing output signals indicative thereof, output signals indicative of at least a highest weight one of said subsignals having an integral portion and a fractional portion;
second storage means, having input address receiving structures coupled to said output signals of said first storage means, for storing values indicative of linear combinations of said output signals from said first storage means and for producing output signals indicative of said values, said output signals being indicative of filtered signals.

6. An filter as in claim 5, wherein said first and second storage means each include read only memories.

7. An filter as in claim 5, wherein said second storage means includes carry outputs.

8. An filter as in claim 5, wherein said subsignals are doublets.

9. An filter as in claim 8, wherein there are two delayed input signals, $E_1$ and $E_2$, which can be expressed as:

$$E_1 = \sum_{i=0}^{7} a_i 2^i$$

$$E_2 = \sum_{i=0}^{7} b_i 2^i$$

-continued $$E_3 = \sum_{i=0}^{7} c_i 2^i$$

with $E_3$ being the delayed signal, and said subdividing means includes means for subdividing into doublets according to the relations:

$$E_1 = \sum_{j=0}^{3} A_j, \quad E_2 = \sum_{0}^{3} B_j, \quad E_3 = \sum_{0}^{3} C_j$$

with $$A_j = a_{2j+1} \cdot 2^{2j+1} + a_{2j} \cdot 2^{2j}$$

$$B_j = b_{2j+1} \cdot 2^{j+1} + b_{2j} \cdot 2^{2j}$$

$$C_j = c_{2j+1} \cdot 2^{j+1} + c_{2j} \cdot 2^{2j}.$$

10. A method of digital filtering, comprising the steps of:
delaying an input signal to produce delayed input signals;
subdividing said input signal and said delayed input signals into subsignals which are weighted by magnitude;
storing in advance linear combinations of values as weighted by respective weighting factors of each of said subsignals in a first storage means;
addressing said first storage means using said subsignals, to receive output signals indicative of said values, said output signals of said first storage means from at least a highest weighted subsignal having an integral portion and a fractional portion;
storing in advance values indicative of linear combinations of output signals from said first storage means;
using said output signals from said first storage means to address said second storage means; and
using output signals from said second storage means as filterd signals.

11. A method as in claim 10, wherein there are two delayed input signals, $E_1$ and $E_2$, which can be exprressed as:

$$E_1 = \sum_{i=0}^{7} a_i 2^i$$

$$E_2 = \sum_{i=0}^{7} b_i 2^i$$

$$E_3 = \sum_{i=0}^{7} c_i 2^i$$

with $E_3$ being the delayed signal, and said subdividing means includes means for subdividing into doublets according to the relations:

$$E_1 = \sum_{j=0}^{3} A_j, \quad E_2 = \sum_{0}^{3} B_j, \quad E_3 = \sum_{0}^{3} C_j$$

with $$A_j = a_{2j+1} \cdot 2^{2j+1} + a_{2j} \cdot 2^{2j}$$

$$B_j = b_{2j+1} \cdot 2^{j+1} + b_{2j} \cdot 2^{2j}$$

$$C_j = c_{2j+1} \cdot 2^{j+1} + c_{2j} \cdot 2^{2j}.$$

* * * * *